(12) United States Patent
Asami (10) Patent No.: US 7,173,443 B1
(45) Date of Patent: Feb. 6, 2007

(54) SEMICONDUCTOR TEST SYSTEM (75) Inventor: Koji Asami, Fukaya (JP)

(73) Assignee: Advantest Corp., Tokyo (JP)

( * ) Notice: Subject to any disclaimer, the term of this patent is extended or adjusted under 35 U.S.C. 154(b) by 1509 days.

(21) Appl. No.: 09/443,021

(22) Filed: Nov. 18, 1999

(30) Foreign Application Priority Data

Nov. 24, 1998 (JP) .......................................... 10-332573

(51) Int. Cl.
*G01R 31/26* (2006.01)
*G01R 31/02* (2006.01)
*G01R 13/14* (2006.01)

(52) U.S. Cl. ...................... 324/765; 324/760; 324/76.15

(58) Field of Classification Search ................ 324/765, 324/760, 121 R, 76.15, 76.16, 76.17
See application file for complete search history.

(56) References Cited

U.S. PATENT DOCUMENTS

| 4,641,246 A | * | 2/1987 | Halbert et al. | ........... 324/121 R |
| 4,755,951 A | * | 7/1988 | Holister | ...................... 341/122 |
| 4,807,147 A | * | 2/1989 | Halbert et al. | ........... 324/121 R |
| 4,967,150 A | * | 10/1990 | Brust | ........................... 324/751 |
| 5,589,763 A | * | 12/1996 | Burns | ....................... 324/76.15 |
| 5,748,124 A |   | 5/1998 | Rosenthal et al. | |
| 5,875,213 A | * | 2/1999 | Asami et al. | ................. 329/300 |
| 5,909,186 A |   | 6/1999 | Gohringer | |
| 6,087,825 A | * | 7/2000 | Eguchi et al. | ........... 324/121 R |
| 6,265,860 B1 | * | 7/2001 | Eguchi et al. | ............ 324/76.17 |

* cited by examiner

*Primary Examiner*—Safet Metjahic
*Assistant Examiner*—Jermele M. Hollington
(74) *Attorney, Agent, or Firm*—Muramatsu & Associates (57) ABSTRACT

A mixed signal test system for testing a semiconductor device having both an analog function and a digital function achieves improved resolution and low cost. The test system is formed of a functional test unit for testing a digital function of a device under test (DUT), an analog test unit (ATU) for testing an analog function of the DUT, and a synchronous control unit for synchronizing operations between the functional test unit and the analog test unit. The analog test unit includes a digitizer for converting an analog output of the DUT into a digital signal, and an acquisition memory for storing the digital signal from the digitizer in specified addresses. The wave form of the analog output is repeated by a plurality of cycles and a sampling clock for the digitizer is phase shifted by a predetermined amount for each cycle.

13 Claims, 10 Drawing Sheets

SEMICONDUCTOR TEST SYSTEM

FIELD OF THE INVENTION

This invention relates to a semiconductor test system for testing semiconductor devices such as mixed signal ICs and LSIs, and more particularly, to a semiconductor test system having a digitizer for continuously performing AD conversion of an analog signal from a device under test where an equivalent sampling frequency in the AD conversion is substantially increased.

BACKGROUND OF THE INVENTION

In testing semiconductor devices such as ICs and LSIs by a semiconductor test system, such as an IC tester, a semiconductor IC device to be tested is provided with test signals produced by an IC tester at its appropriate tester pins (channels) at predetermined test timings. The IC tester receives output signals from the IC device under test generated in response to the test signals. The output signals are strobed by strobe signals with predetermined timings to be compared with expected data to determine whether or not the IC device properly performs the intended functions. This is a basic process for testing a logic device by a semiconductor test system.

A semiconductor device to be tested may also include analog functional blocks such as an AD converter and/or a DA converter as well as a digital functional block. Such a semiconductor device is sometimes called a mixed signal IC. An example of such a mixed signal IC is a semiconductor integrated circuit designed for modems, audio and/or video devices, and the like.

Figure 4:
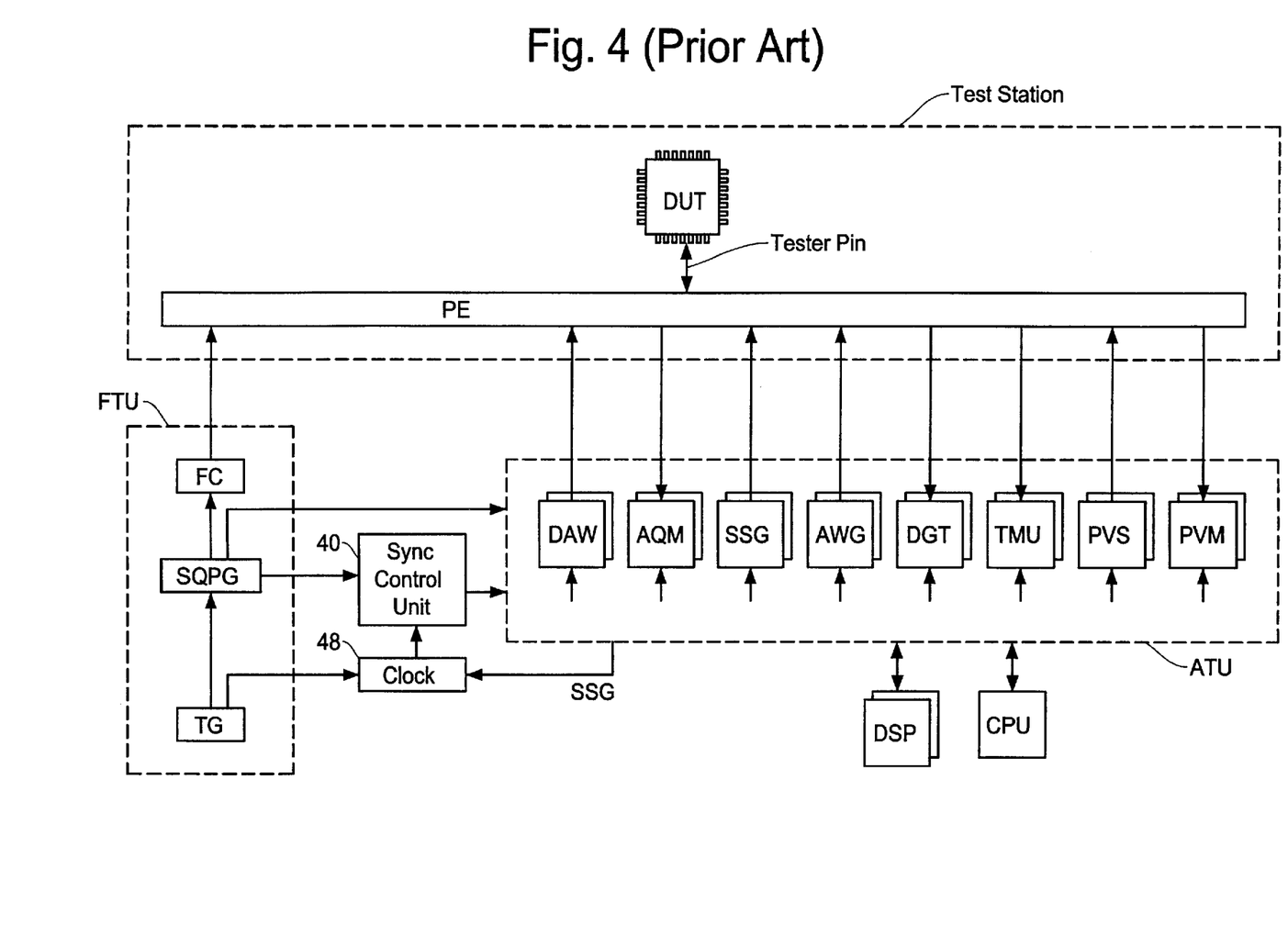
FIG. 4 is a schematic block diagram showing a basic structure of a mixed signal semiconductor test system in the conventional technology.

An example of semiconductor test system for testing such a mixed signal IC device (mixed signal test system) in the conventional technology is shown in FIGS. 4–7. FIG. 4 shows a basic structure in the conventional mixed signal test system and FIGS. 5–7 relate to a digitizer in the mixed signal test system. A device under test (DUT) is a mixed signal IC including an analog function and a digital function. When testing, the DUT is place on a test station to receive test signals from the mixed signal test system and produce response outputs. The mixed signal test system of FIG. 4 includes a functional test unit (FTU) for testing a digital function of the DUT and an analog test unit (ATU) for testing an analog function of the DUT and a synchronous control unit 40 for synchronizing the functional test unit (FTU) and the analog test unit (ATU) with one another.

Figure 5:
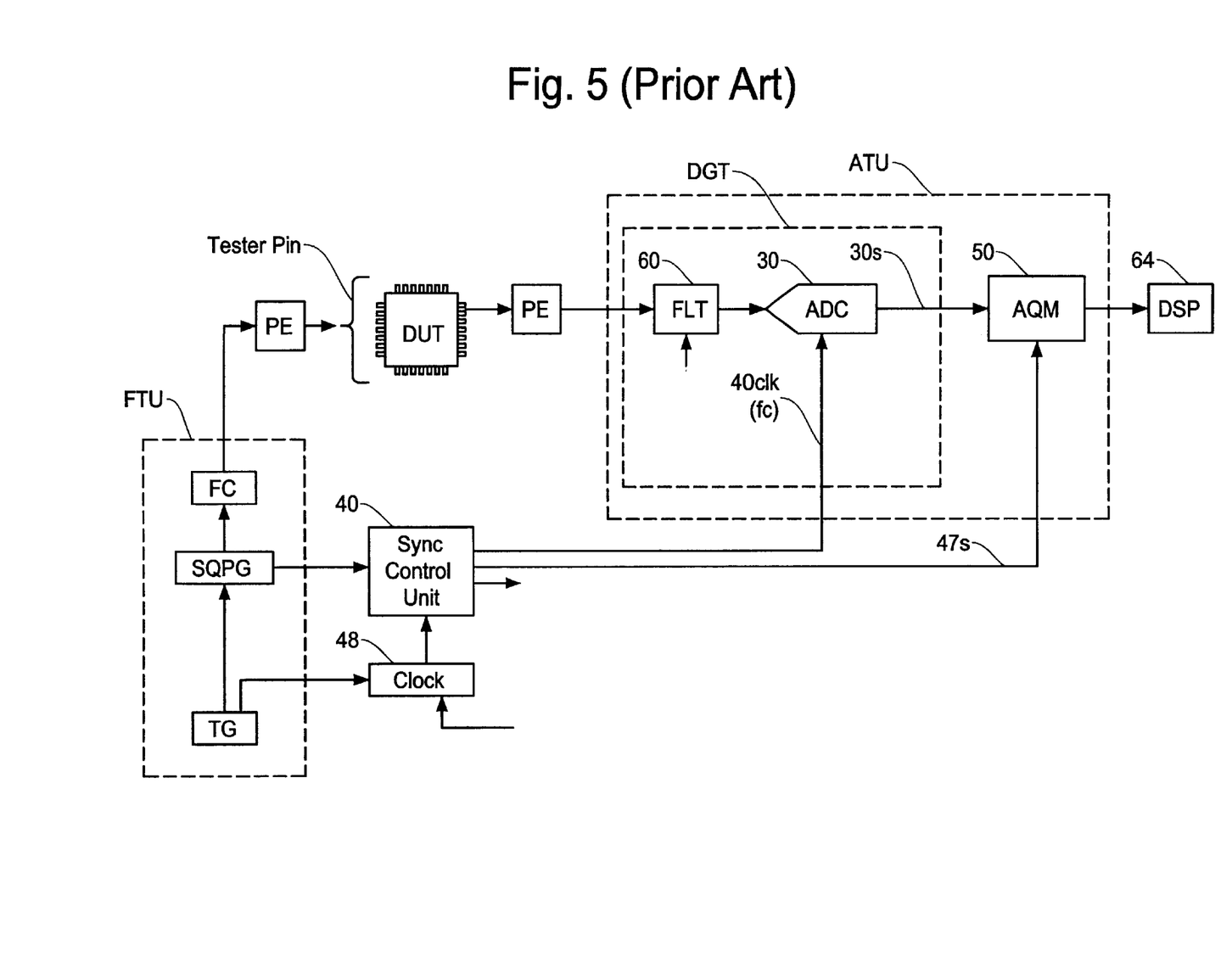
FIG. 5 is a schematic block diagram showing a basic structure of a digitizer in mixed signal test system of conventional technology.

In FIGS. 4 and 5, the functional test unit (FTU) includes a timing generator TG, a pattern generator such as an algorithmic pattern generator (ALPG) or a sequential pattern generator (SQPG), and a format controller (FC). The functional test unit (FTU) has a large number of tester pins (channels), such as 256 pins, corresponding to terminal pins of the device to be tested (DUT). At the output of the format controller FC, each tester pin provides a test pattern to the corresponding pin of the DUT.

The timing generator TG generates timing signals such as a rate clock to synchronize the timing of the functional test unit and provides the timing pulses to the pattern generator SQPG. The test pattern generator SQPG generates a test pattern based on a test program in response to the rate clock from the timing generator TG. The timing generator TG also generates timing data and wave form data to be used in the format controller FC to produce tester pin rates, delay timings and wave forms in the test pattern. The test pattern at the output of the format controller FC is provided to the DUT through a pin electronics PE.

The synchronous control unit 40, although not shown, includes an event master and a digital/analog synchronous controller. In receiving signals generated by the pattern generator SQPG, the synchronous control unit 40 produces a start signal and a trigger signal to be provided to the analog test unit (ATU). The start signal and trigger signal are used to synchronize test patterns generated by the functional test unit FTU and test signals generated by the analog test unit and measurement timings in the analog test unit. A clock generator 48 receives clock signals such as the rate clock from the timing generator TG and a clock from a synthesized signal generator (SSG) in the analog test unit to produce appropriate clock signals to be used in the analog test unit (ATU).

In the example of FIG. 4, the analog test unit (ATU) includes a variety of functional blocks such as a digital arbitrary wave form generator (DAW) for generating digital wave form data, an acquisition memory (AQM) for storing digital codes of an output signal of the DUT, a synthesized signal generator (SSG) for generating signals of various frequencies, an arbitrary wave form generator (AWG) for generating signals with wave forms defined by the wave form data from DAW, a digitizer (DGT) for converting an analog signal into a digital signal, a time measurement unit (TMU) for measuring time intervals and frequencies of an incoming signal, a precision voltage generator (PVS) for generating a reference DC voltage, a precision voltage meter (PVM) for measuring a DC voltage, a digital signal processor (DSP) for digital processing on digital data and a controller (CPU) for an overall operational control of the analog test unit(ATU).

Plural sets of the above listed resources may be provided in the analog test unit for performing signal generation and signal measurements in response to the synchronous signal from the synchronous control unit 40. The analog test unit and the terminal pins of the DUT are connected through the pin electronics (PE).

FIG. 5 schematically shows a structure in the digitizer (DGT) in the analog test unit (ATU). The digitizer DGT of FIG. 5 includes a filter (FLT) 60 and an AD converter (ADC) 30. Since a wide variety of output signals, such as high speed signals or high precision wave forms, will be produced by the DUT, the AD converter 30 may constitute a plurality of AD converters with different degrees of speed and resolution. For example, the AD converter may include a combination of a high speed AD converter with 12-bit resolution and 100 MHz sampling rate and a high precision AD converter with 26-bit resolution and 100 KHz sampling rate.

The filter 60 is an antialiasing filter which is typically a low pass filter to prevent aliasing effects involved in a sampling process. A plurality of such filters with different pass band frequencies may be selectively used depending on the sampling frequencies. Typically, as an antialiasing filter, the filter 30 removes frequency components higher than ½ of the sampling frequency $f_c$ from the output signal of the DUT received through the pin electronics PE. The output of the filter 60 is provided to the AD converter 30.

The AD converter 30 samples an input signal from the filter 60 at each edge of the sampling clock $40_{clk}$ having a sampling frequency $f_c$ and converts the sampled voltage to a digital signal, i.e., code data $30_s$. The code data $30_s$ is stored in the acquisition memory (AQM) 50 in response to a memory timing signal $47_s$ from the synchronous control unit 40. The stored data in the acquisition memory (AQM) 50 is used for signal analysis and evaluation such as by the digital signal processor (DSP) 64.

Figure 6:
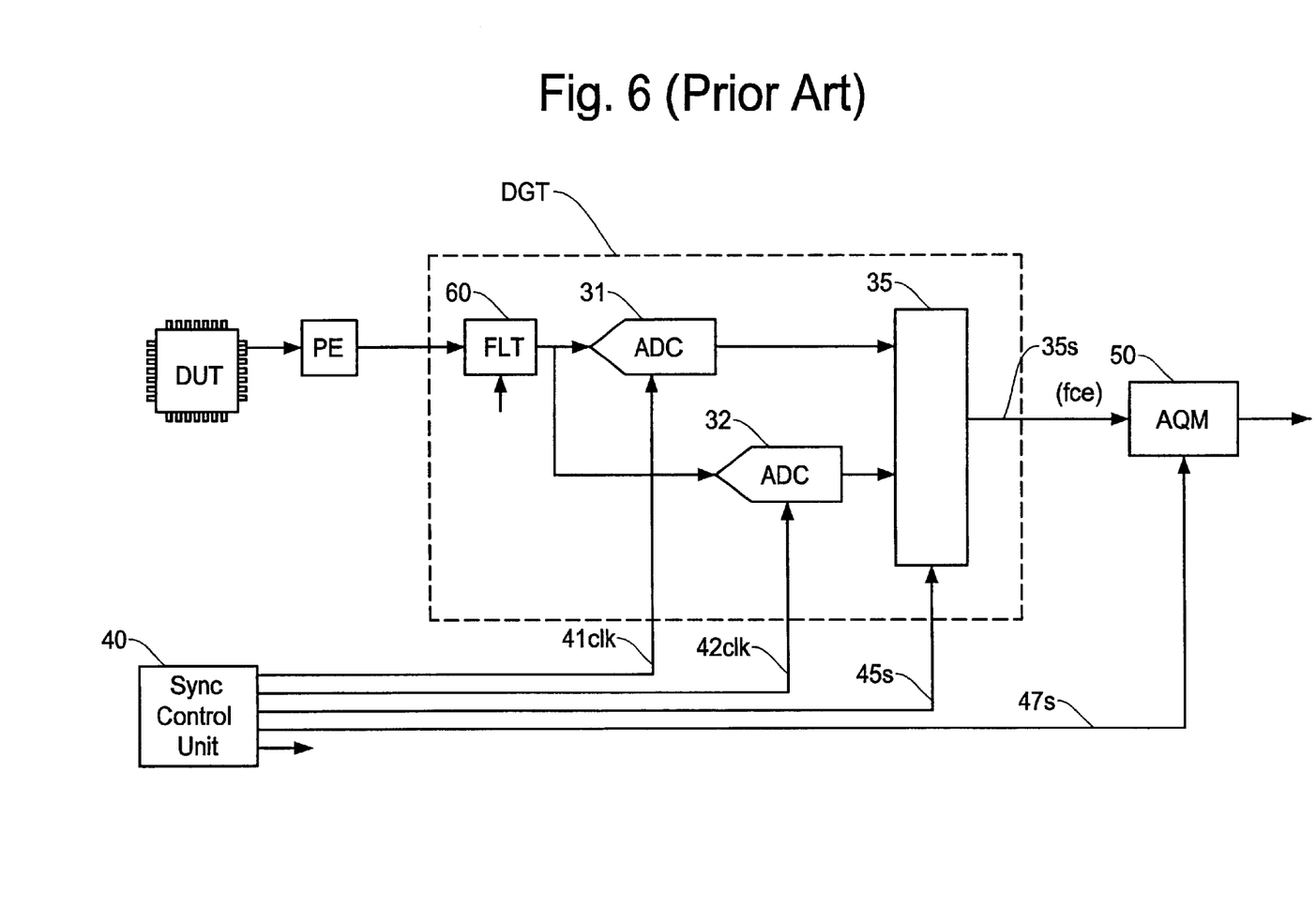
FIG. 6 is a schematic block diagram showing a basic structure of a digitizer in the conventional technology for increasing an equivalent sampling rate by two times with use of two AD converters.

Since high resolution data can be obtained by increasing the number of sampling points, generally, a digitizer uses a highest possible sampling frequency to achieve both high even higher than the highest sampling frequency of an AD converter, an example of circuit arrangement such as shown is FIG. 6 is used in the conventional technology. In FIG. 6, two AD converters 31 and 32 are arranged so as to operate in an interleave fashion for increasing the overall sampling speed by two times of each AD converter.

Namely, the digitizer of FIG. 6 includes a filter (FLT) 60, a first AD converter 31, a second AD converter 32, and a multiplexer 35. The filter 60 is designed to function as an antialiasing filter for an equivalent sampling frequency $f_{ce}$ which is two times higher than a sampling frequency of each of the AD converters 31 and 32. The synchronous control unit 40 provides sampling clocks $41_{clk}$ and $42_{clk}$ to the first and second AD converters 31 and 32, respectively. The synchronous control unit 40 also provides a square wave clock $45_s$ to the multiplexer 35, and a memory timing signal $47_s$ to the acquisition memory 50.

Figure 7A:
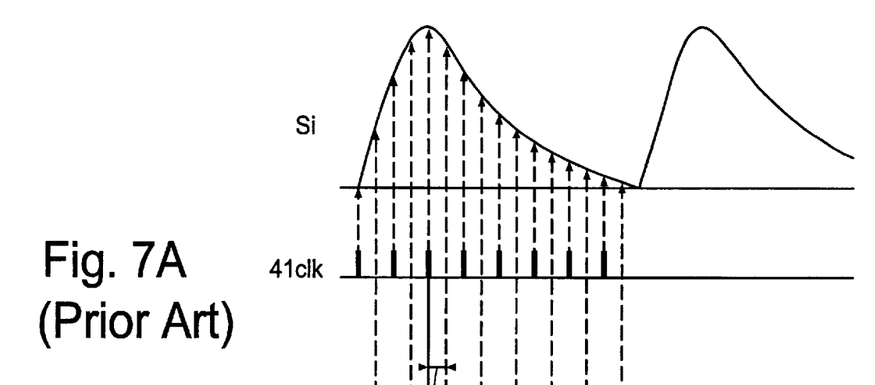
FIG. 7 is a timing chart showing the wave forms and timing relationships in the conventional digitizer of FIG. 6 using the two AD converters.
Figure 7B:
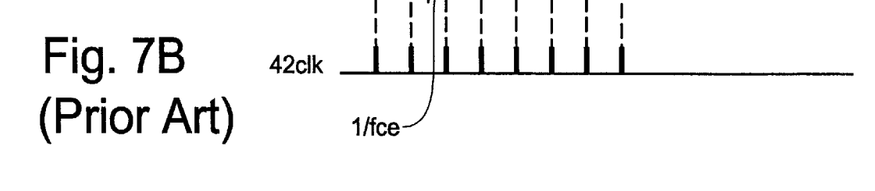
Figure 7C:
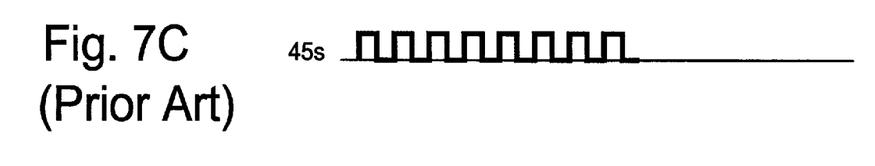

FIGS. 7A–7C are timing charts showing the timing relationship between the first and second AD converters 31 and 32 and an overall sampling rate at the output of the multiplexer 35. As shown in FIG. 7A, the first AD converter 31 samples an input signal $S_i$ from the filter 60 by a first sampling clock $41_{clk}$ from the synchronous control unit 40 which is the highest possible sampling frequency. As shown in FIG. 7B, the second AD converter 32 samples the input signal $S_i$ from the filter 60 by a second sampling clock $42_{clk}$ from the synchronous control unit 40 which is the highest possible sampling frequency.

The multiplexer 35 receives the digitized codes from the first and second AD converters 31 and 32 and alternately selects the codes at the timing of each rising edge and falling edge of the square clock signal $45_s$ having the same repetition rate as that of the sampling clocks $41_{clk}$ and $42_{clk}$. The clock signal $45_s$ has a square shape so as to have the same time interval between any adjoining two edges. Thus, an output signal 35s of the multiplexer 35 has an equivalent sampling frequency $f_{ce}$ which is two times higher than the clock rate of the first or second sampling clock.

In the example of FIGS. 6 and 7, although only two AD converters are shown just for an illustration purpose, three or more AD converters are used to establish three or more higher equivalent sampling rates. Namely, in the conventional technology, to increase the overall sampling rate, a plurality of AD converters are arranged to operate in parallel fashion while the outputs of the AD converters are combined to form a serial signal having a repetition rate which is the plurality of times higher than that of each AD converter.

In the conventional technology, however, to increase the overall sampling rate, the number of circuit components such as AD converters increases in proportion to the increase of the sampling rate. As a consequence, in the conventional technology involving the interleave method, there is a problem that the circuit size and cost of the digitizer increases with the increase of the sampling rate.

SUMMARY OF THE INVENTION

It is, therefore, an object of the present invention to provide a digitizer which is capable of increasing an equivalent sampling rate without involving any substantial increase in the circuit components.

It is another object of the present invention to provide a digitizer which is capable of increasing an equivalent total sampling rate with using a single AD converter and without increasing a frequency of a sampling clock to an AD converter.

It is a further object of the present invention to provide a mixed signal semiconductor test system which is capable of converting an analog output signal of a device under test to a digital signal with high conversion speed and high resolution.

It is a further object of the present invention to provide a mixed signal semiconductor test system which is capable of converting an analog output signal of a device under test to a digital signal with high conversion speed and high resolution and storing the digital signal in a memory at a predetermined address sequence.

In the present invention, the mixed signal test system for testing a semiconductor device having both an analog function and a digital function is comprised of a functional test unit for testing a digital function of a device under test (DUT) by providing a logic test pattern to the DUT and evaluating a response output of the DUT, an analog test unit for testing an analog function of the DUT by providing a test signal to the DUT and evaluating an analog output of the DUT, and a synchronous control unit for synchronizing operations between the functional test unit and the analog test unit, wherein the analog test unit includes a digitizer for converting the analog output of the DUT whose wave form in a fixed time period T is repeated by a plurality of cycles into a digital signal wherein a sampling clock for sampling the analog output is phase shifted by a predetermined amount for each cycle, and an acquisition memory for storing the digital signal from the digitizer in specified addresses thereof.

In another aspect of the present invention, an address generator is provided to generate address data in a predetermined order to store the digital data from the digitizer in the continuous addresses of the acquisition memory in the order of sampling points on the analog output with a difference of the phase shift.

According to the present invention, an input analog signal which repeats the same wave form in the time period T by M cycles is sampled by the digitizer for the M cycles wherein a phase of the sampling clock is shifted by a predetermined amount ΔP (delta phase) for each cycle. As a result, the data obtained in the AD conversion process of the present invention shows resolution M times higher than that obtained in the normal AD conversion, i.e., an equivalent ;sampling frequency is increased by M times. Therefore, a digitizer of high resolution and high speed is achieved without using a plurality of AD converters or a higher frequency sampling clock. Accordingly, the mixed signal test system having a high performance digitizer is realized with low cost and small circuits size.

DESCRIPTION OF THE PREFERRED EMBODIMENTS

Figure 1:
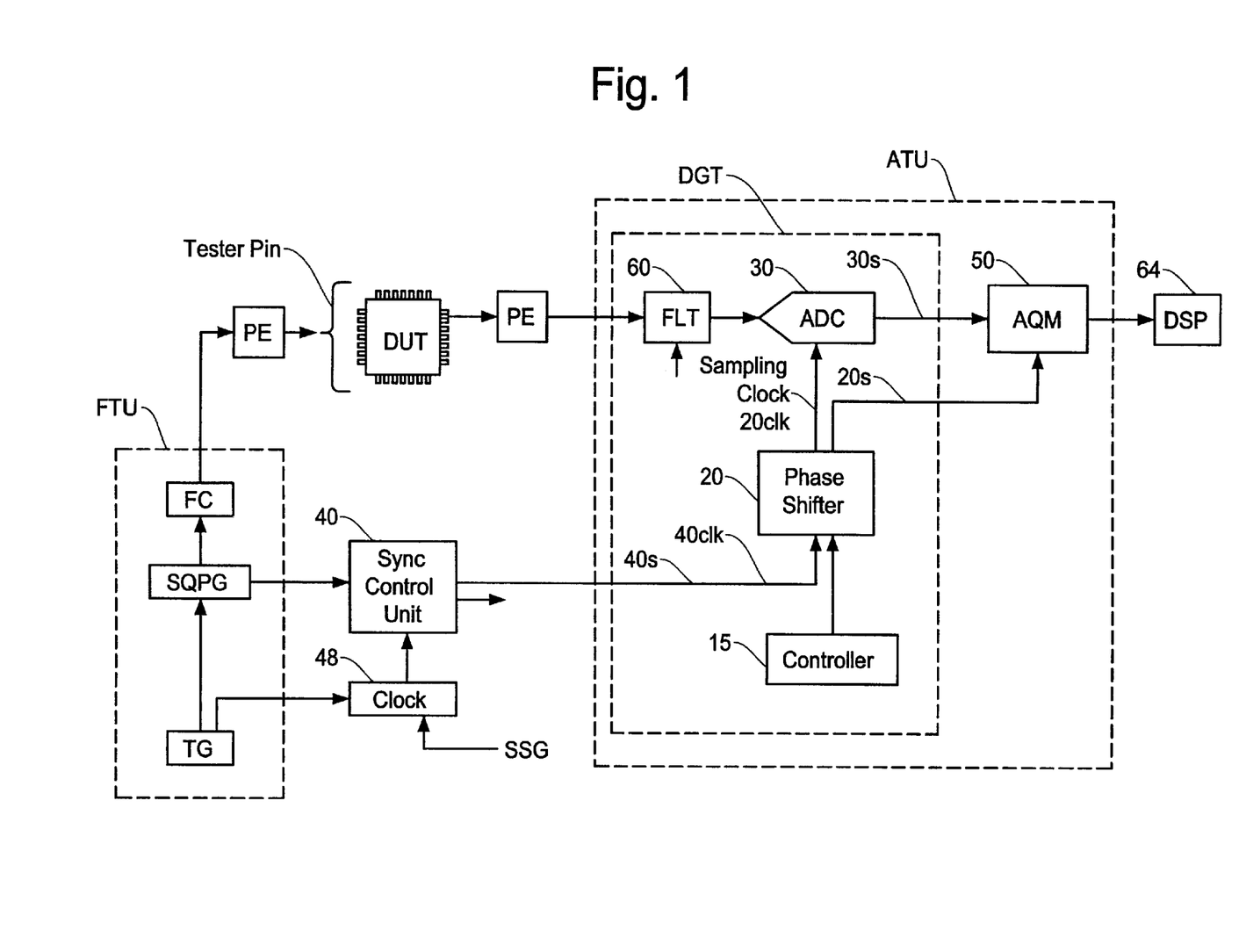
FIG. 1 is a schematic block diagram showing an example of structure of the mixed signal test system of the present invention with an emphasis on a digitizer.
Figure 2A:
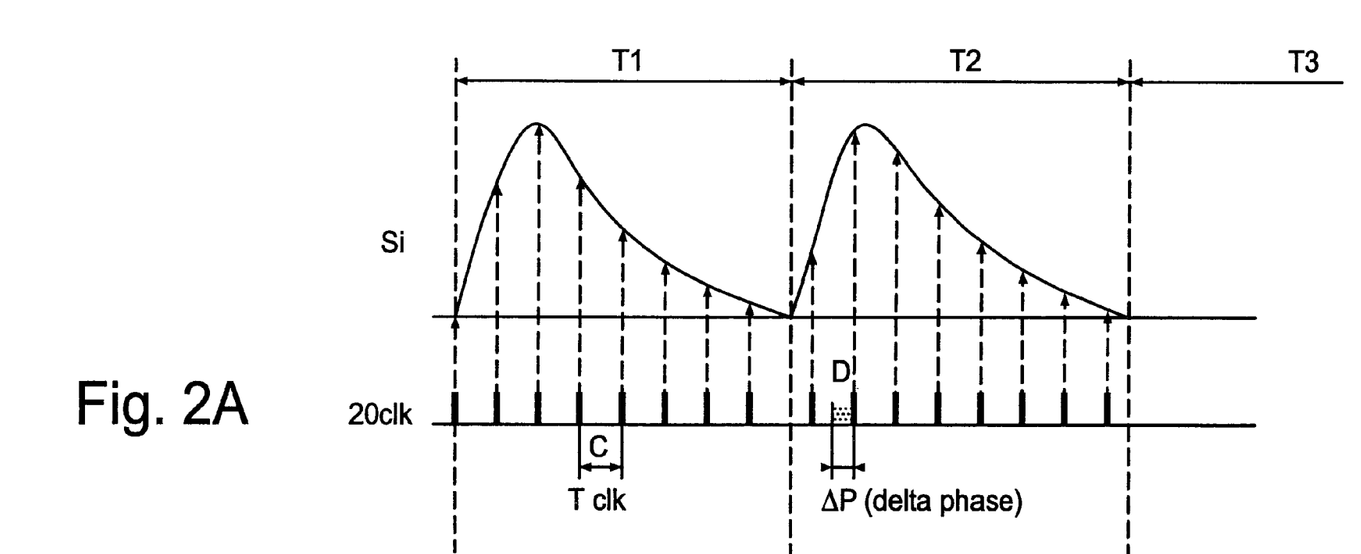
FIGS. 2A and 2B are timing charts showing a wave form and timing relationship in the digitizer used in the mixed signal test system of FIG. 1.
Figure 2B:
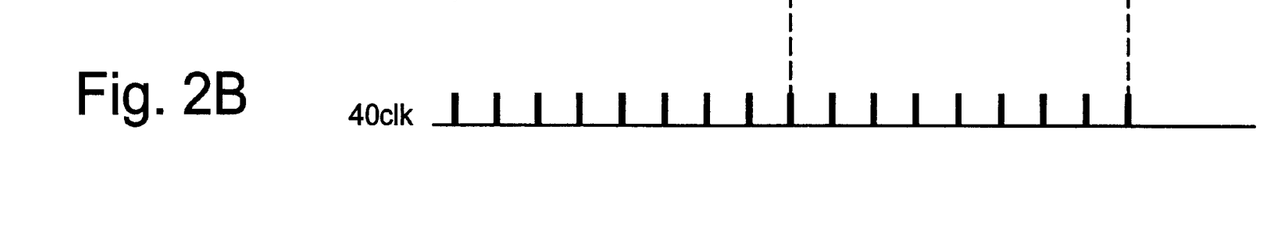
Figure 3:
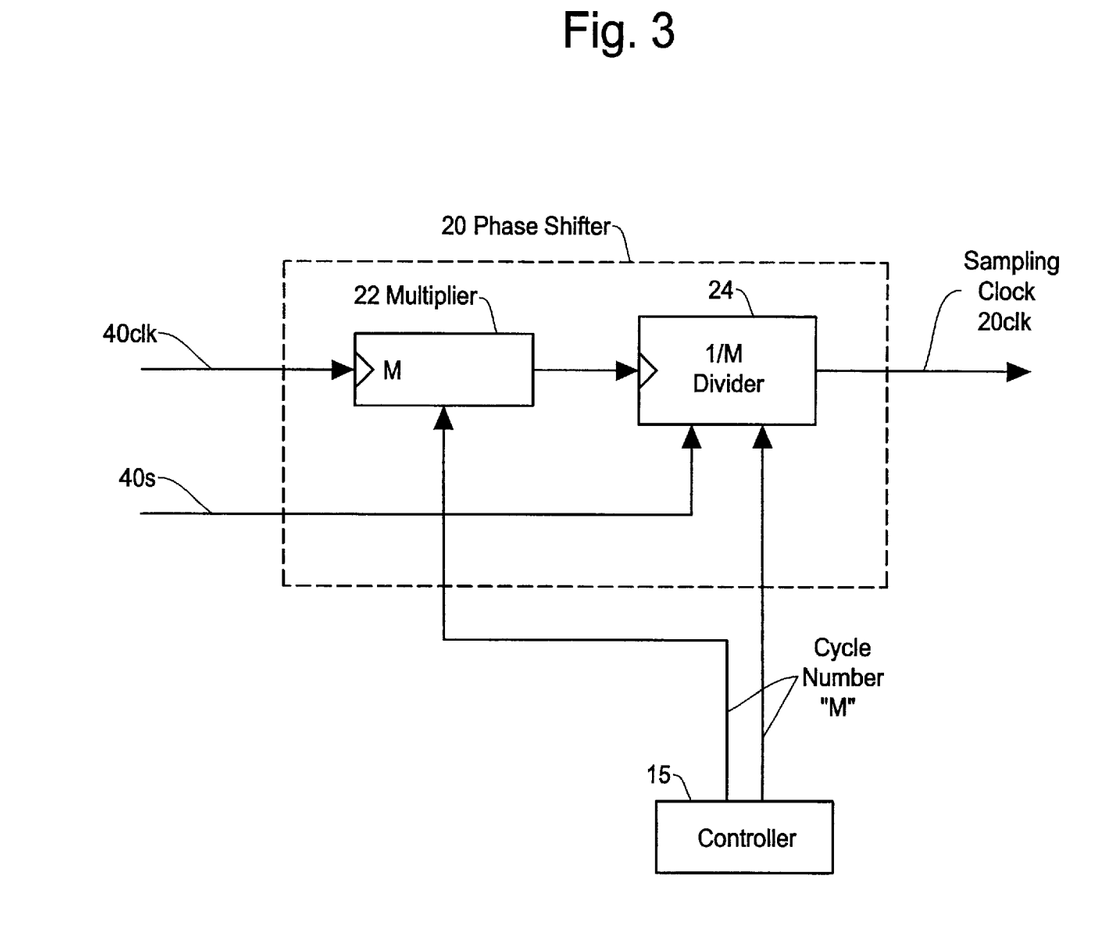
FIG. 3 is a schematic block diagram showing a basic configuration of a phase shifter incorporated in the digitizer of the present invention.

An embodiment of the present invention is shown in FIGS. 1–3. An example of structure of the mixed signal semiconductor test system of the present invention is shown in a block diagram of FIG. 1 in which an emphasis is placed on a digitizer DGT. In the present invention, to increase the sampling rate of the digitizer, a phase of the sampling clock signal is shifted by a predetermined degree for each cycle of an input analog signal.

This invention is based on the fact that, almost always, a wave form of a time period T shown in FIGS. 2A and 2B in an output analog signal of a device under test (DUT) is repeated by a plurality of times. This is because, in a mixed signal test system, clock and other signals can be freely supplied to the DUT from the test system so that the repetition rate of the output analog signal of the DUT can be controlled or predictable by the test system. Thus, in the present invention, a digitizer DGT in the mixed signal test system includes only one AD converter (ADC) where a sampling phase is shifted at each cycle of the input analog signal, thereby increasing an equivalent sampling frequency and sampling resolution in the AD conversion process.

The wave form of the input analog signal and a timing relationship in the digitizer used in the mixed signal test system of FIG. 1 are shown in FIGS. 2A and 2B. As noted above, it is assumed that the input signal $S_i$ to be digitized has a wave form which repeats two cycles or more as a unit of a constant time period T. Since the mixed signal test system provides a start signal, a clock signal or other signals to the DUT, it is also assumed that the timing of the test system and one cycle period T of the analog signal can be matched with one another.

Even though such timings between the analog input signal and the test system are not synchronized, the present invention of shifting the phase of the sampling clock is still feasible. For example, if the test system can measure each time period (time length of one cycle) of the analog signal such as by a time measurement unit (TMU) of FIG. 4, an appropriate sampling clock for the input analog signal can be easily determined. Thus, the phase shift of the sampling clock can be conducted to increase the overall sampling rate in the digitizer.

In the example of FIG. 1, the digitizer DGT includes a filter 60, an AD converter 30, a phase shifter 20, a controller 15, and a synchronous control unit 40. The filter 60 and the AD converter 30 are the same as that shown in the conventional technology of FIG. 5. The synchronous control unit 40 provides a sampling clock $40_{clk}$ and a constant period signal $40_s$ to the phase shifter 20. The constant period signal $40_s$ is a pulse signal repeating with a time period T which is the same time length of one cycle of an input analog signal.

The controller 15 provides information regarding an amount of phase shift, or delta phase ΔP (FIG. 2A and 10B), to the phase shifter 20. The delta phase ΔP is added to the phase of the sampling clock $40_{clk}$ in the next cycle (period) T. In the example of FIG. 3, such information on the phase shift is M which is typically a number of cycles the same wave form of period T is repeated in the analog signal. Based on the number "M" from the controller 15, the phase shift is performed by M times, thereby increasing an overall sampling frequency of the AD conversion by M times.

In receiving the sampling clock $40_{clk}$ and the constant period signal $40_s$ from the synchronous control unit 40 as well as the phase shift information "M" from the controller 15, the phase shifter 20 produces a phase shifted sampling clock $20_{clk}$ for the AD converter 30. The phase shifter 20 produces the sampling clock $20_{clk}$ by adding the delta phase shift ΔP at each period T to the sampling clock of the previous period. Namely, in the case where the input analog signal of a time period T is AD converted for M cycles, the delta phase ΔP is 360°/M. For example, if M is 8, 360°/8= 45°, thus, in the first period T, the phase shift is zero, while in the second period T, the phase shift is 45°, and in the following periods, the respective phase shifts are 90°, 135°, 180°, . . . 360°.

In this manner, the phase, of the sampling clock is shifted by the unit of the delta phase ΔP at each period T of the analog signal. The output of the AD converter 30 is stored in the acquisition memory (AQM) 50 for the analysis in the later stages of the test system. The above noted operation in the digitizer DGT of the present invention is equivalent to have M AD converters in parallel and combine the digital outputs to form a serial form. Thus, the overall sampling rate of the digitizer DGT is increased by M times.

It should be noted that, for the present invention be effective, the analog output signal of the DUT with the constant time period T must repeat for M cycles. As can be seen in the foregoing, the smaller the delta phase ΔP, the higher the sampling rate and sampling resolution it becomes. However, for such a small delta phase ΔP, a sample and hold circuit (not shown) included in the AD converter 30 must be capable of high performance such as high voltage accuracy.

An example of basic configuration of the phase shifter 20 is shown in FIG. 3. In this example, the phase shifter 20 is comprised of a frequency multiplier 22 and a frequency divider 24 connected in series. The frequency multiplier 22 multiplies the frequency of the sampling clock $40_{clk}$ by M times and the frequency divider 24 divides the output frequency of the multiplier 22 by M to form the sampling clock $20_{clk}$ for the AD converter 30. The controller 15 provides such information "M" to the frequency multiplier 22 and the frequency divider 24.

As shown in FIG. 3, the constant period signal $40_s$ is provided to the frequency divider 24. In this arrangement, every time when the constant period signal $40_s$ is received, i.e., at every time period T, the frequency divider 24 skips its dividing operation. Namely, the dividing operation corresponding to one pulse in the output of the frequency multiplier 22 is disabled by an edge of the constant period signal $40_s$. As a result of which, the sampling clock $20_{clk}$ is phase shifted by ΔP at each time period T of the input analog signal. In the example of FIG. 3, if the synchronous control unit 40 is able to provide a sampling clock of M times higher frequency than the sampling clock $40_{clk}$, the frequency multiplier 22 is unnecessary. Such a phase shifting operation can be also achieved by, for example, a phase lock loop (PLL) IC available in the market.

Timing charts of FIG. 2A and 2B show the case where the AD conversion is performed for two cycles of the input analog signal Si, i.e., M=2. In other words, the phase is shifted by 180° in the second cycle, i.e., the delta phase ΔP=180°. In FIG. 2, the first cycle is denoted by T1 and the second cycle is denoted by T2, where the first cycle T1 and second cycle T2 have the same time period T. In the first cycle T1, the sampling clock $20_{clk}$ does not involve any phase shift, and thus is the same as the original sampling clock $40_{clk}$ of FIG. 2B. In the second cycle T1, as shown in FIG. 2A, the sampling clock $20_{clk}$ is phase shifted by ΔP=180° relative to the original sampling clock $40_{clk}$ of FIG. 2B.

Since the frequency of the sampling clock $20_{clk}$ is unchanged, the AD converter is able to convert the input analog signal to a digital signal. Further, the sampling points on the analog signal are shifted by a 50% duty cycle, i.e, 180°, of the original sampling clock $40_{clk}$, the digital data obtained by the sum of the first cycle T1 and the second cycle T2 is equivalent to that would obtained by the sampling frequency of two times higher than the original sampling clock $40_{clk}$.

Although the digitizer in the foregoing can be most advantageously used in the mixed signal test system, other applications are also feasible. For example, the digitizer of the present invention can be used as an AD converter for an input analog signal which repeats the same wave form at least two times. By shifting the phase of the sampling clock for each of M cycles of the input signal by the phase sifter 20, an equivalent sampling rate and sampling resolution is increased by the factor of M.

Figures 10A, 10B:
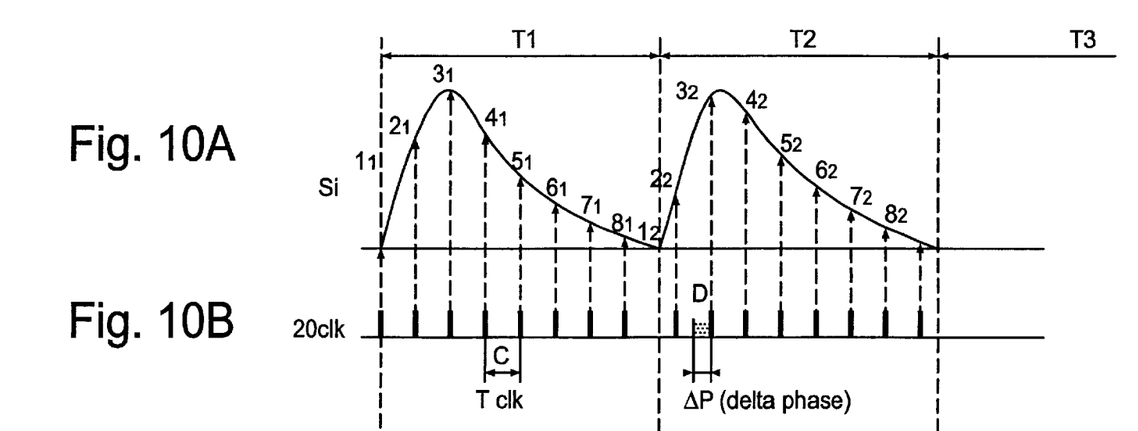
FIGS. 10A–10E are timing charts corresponding to the FIGS. 2A–2B for explaining the address sequence to be generated by the address generator of FIGS. 8 and 9 for accessing the acquisition memory.
Figure 10C:
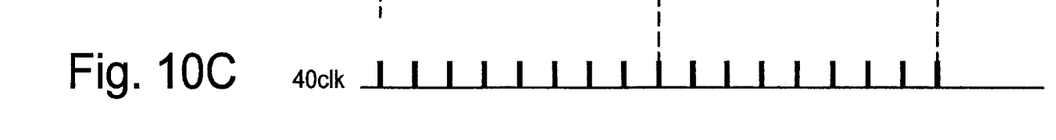

The output of the digitizer DGT is stored in the acquisition memory 50 in the order of the AD conversion, i.e., from the digital data of the sampling points $1_1, 2_1, 3_1, \ldots 8_1, 1_2, 2_2, 3_2, \ldots 8_2$ of FIG. 10A. It is also possible to store the digitized data in the order different from the above, such as $1_1, 1_2, 2_1, 2_2, 3_1, 3_2, \ldots 8_1, 8_2$, i.e., the order of the delta phase ΔP of the sampling points of the analog signal $S_i$ in FIG. 10A. In such a case, the digital data is stored in the acquisition memory (AQM) 50 in a manner that would be acquired by an AD converter actually having a sampling speed of M times (two times in the example of FIG. 10) higher than the AD converter 30, thereby enabling to directly use the digital data in the acquisition memory (AQM) 50 for signal analysis, etc.

Figure 8:
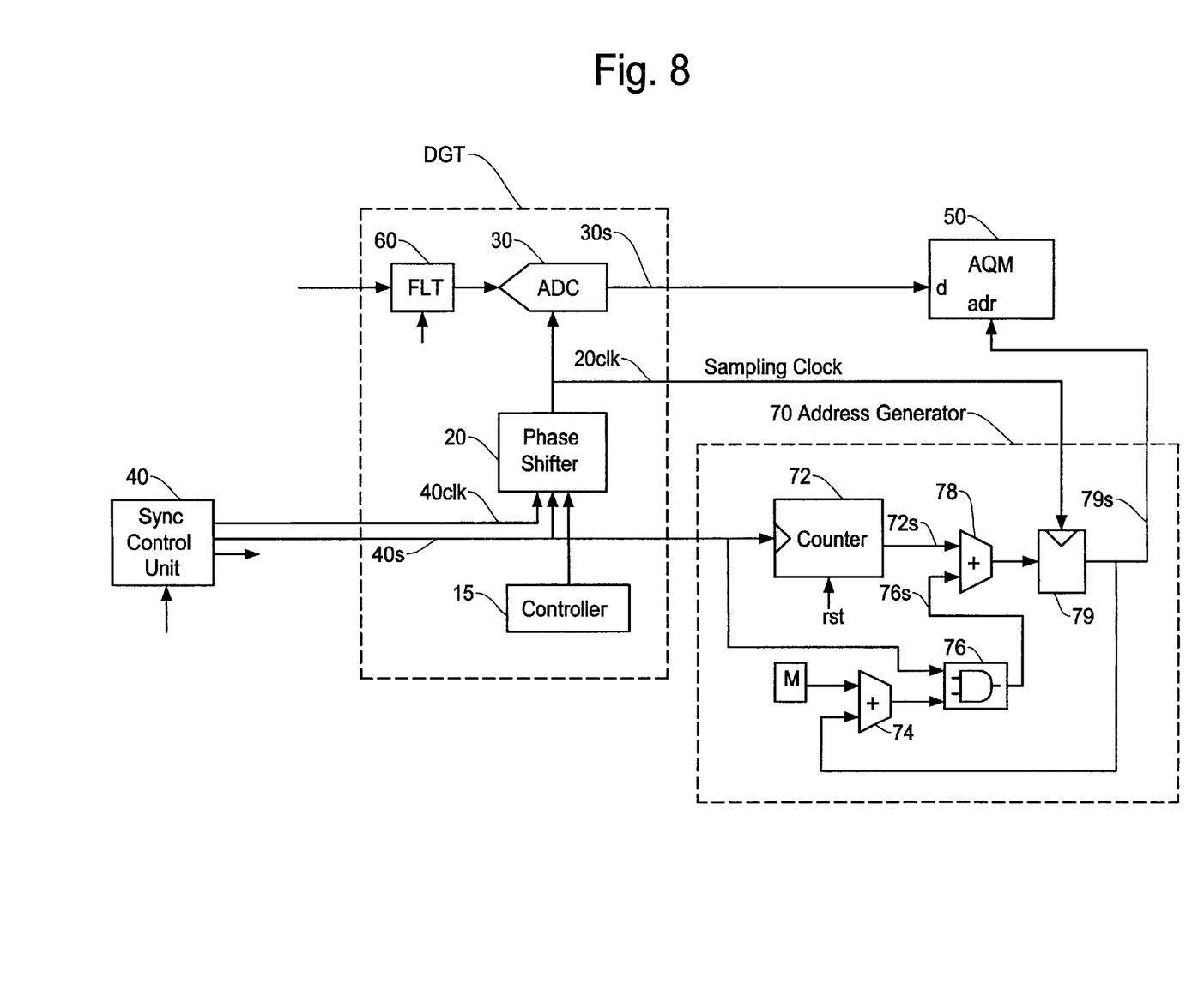
FIG. 8 is a schematic circuit diagram showing an example of address generator for generating address data to store digitized codes in an acquisition memory with a predetermined address sequence.

FIG. 8 shows an example of circuit diagram of an address generator 70 for generating the address sequence noted above for storing the output of the digitizer in the acquisition memory 50. In the example of FIG. 7, the address generator 70 includes a period counter 72, a first adder 74, a gate circuit 76, a second adder 78 and a register 79. The constant period signal $40_s$, having the same time period T of the input analog signal, from the synchronous control unit 40 is provided to the period counter 72 and the gate circuit 76. The phase shifted sampling clock $20_{clk}$ from the phase shifter 20 is provided to the register 79. The first adder 74 is provided with data "M" which indicates a number of cycles of the input analog signal for which the AD conversion noted above is performed.

The period counter 72 is reset to "0" at the start of operation and is incremented by one in receiving the constant period signal $40_s$. The period counter 72 provides an output signal $72_s$ to an input of the second adder 78 whose other input is provided with an output of the gate circuit 76. The first adder is provided with the cycle number "M" as noted above at its one input and an output signal $79_s$ of the register 79 at the other input. The first adder 74 thus provides the sum (accumulated data) of the two inputs to the gate circuit 76.

The gate circuit 76 sets its output to low only when the constant period signal $40_s$ is valid (such as high) while supplies the accumulated data from the first adder 74 to the second adder 78 when the constant period signal $40_s$ is invalid (such as low). The second adder 78 provides the sum of the output signal $72_s$ of the period counter 72 and the accumulated data $76_s$ from the gate circuit 76 to the register 79. In receiving the output data of the second adder 78, the register 79 generates an address signal $79_s$ by the timing of the sampling clock $20_{clk}$.

By the arrangement described above, the address generator 70 generates address signal which accesses the acquisition memory 50 in the order of the delta phase ΔP relative to the input analog signal. Thus, the data stored in the acquisition memory 50 is in the order that would have been obtained directly by a digitizer operating by a sampling frequency of M times higher than the sampling clock $40_{clk}$ or $20_{clk}$. In the above example of FIG. 8, if the number "M" is a power of two, i.e., 2, 4, 8, 16, etc., the lower bits of the address signal $79_s$ may be produced by a counter which increments by one at every pulse of the constant period signal $40_s$ while the upper bits of the address signal $79_s$ may be produced by a counter which increments by one at every sampling clock $20_{clk}$.

Figure 9:
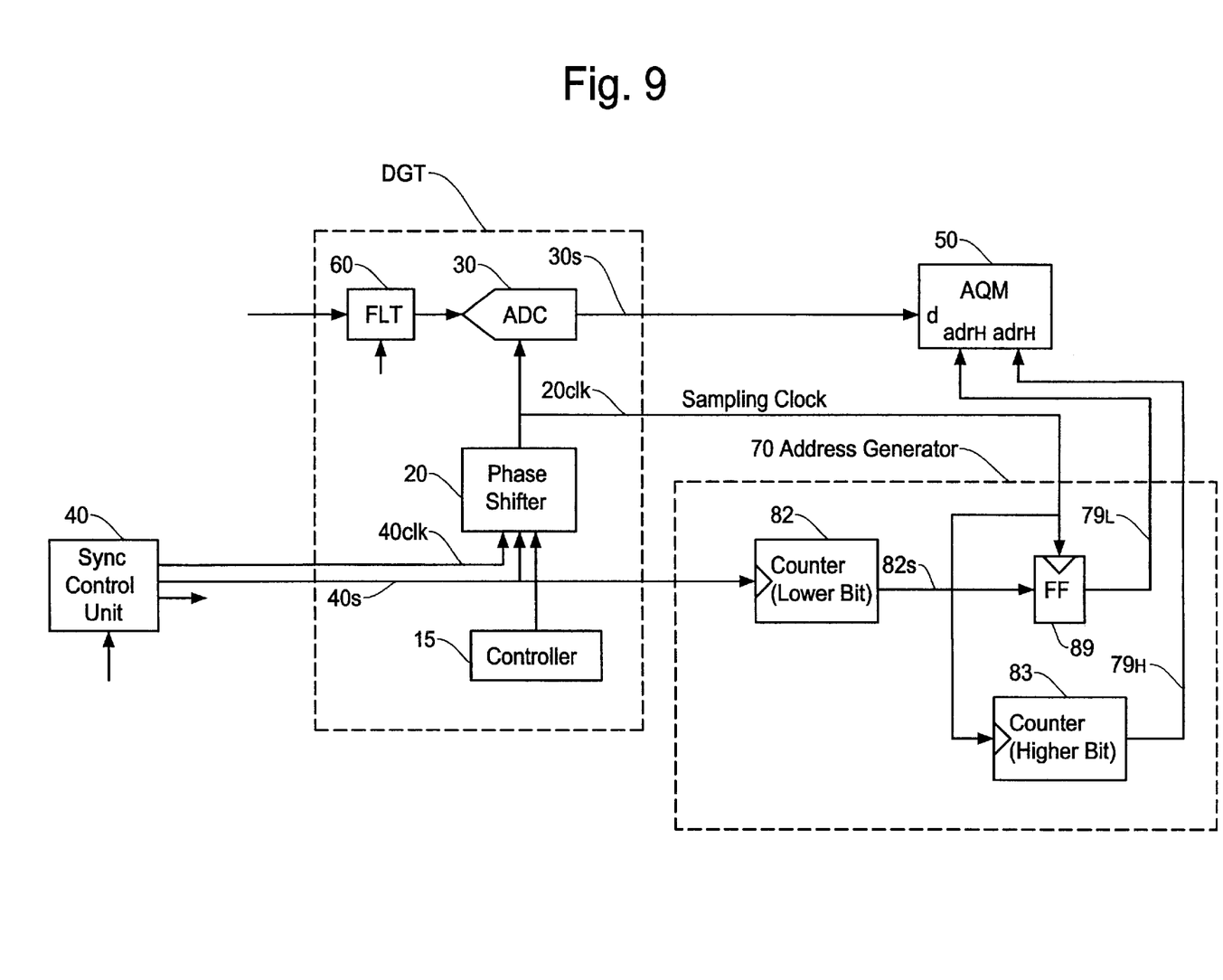
FIG. 9 is a schematic circuit diagram showing another example of address generator for generating address data to store digitized codes in an acquisition memory with a predetermined address sequence.

FIG. 9 is a schematic circuit diagram showing another example of address generator for generating address data to store digital data from the digitizer in the acquisition memory with a predetermined address sequence. As in the above example, this circuit arrangement is effective when the data "M" is a power of two. In the example of FIG. 9, an address generator 70 includes a lower bit counter 82, an upper bit counter 83, and a flip-flop 89. The lower bit counter 82 is provided with the constant period signal $40_s$. The upper bit counter 83 and the flip-flop 89 are provided with the phase shifted sampling clock $20_{clk}$.

The lower bit counter 82 increments by one at every constant period signal $40_s$ to produce a lower bit signal $82_s$. The upper bit counter 83 increments by one at every sampling clock $20_{clk}$ to produce a higher bit address signal $79_H$. The lower bit signal $82_s$ is latched by the timing of the sampling clock $20_{clk}$ by the flip-flop 89, thereby producing a lower bit address signal $79_L$. The lower bit address signal $79_L$ and the higher bit address signal $79_H$ are provided to the acquisition memory 50 to access the acquisition memory to store the data in the order of the phase shift ΔP in the sampling clock on the analog signal.

To summarize the address sequence generated by the address generator 70 in FIGS. 8 and 9, reference is made to the timing charts of FIGS. 10A–10E. Like the example of FIGS. 2A–2B, the AD conversion process in FIG. 10 shows the situation where an input analog signal with a time period T is converted to a digital signal by sampling the analog signal for two cycles, T1 and T2. In the first cycle T1, there is no phase shift involved while in the second cycle T2, the phase of the sampling clock $20_{clk}$ is shifted by 180° from the first cycle.

To store the digitized data in the memory 50 in the order of $1_1, 1_2, 2_1, 2_2, 3_1, 3_2, \ldots 8_1, 8_2$, of the sampling points on the input signal $S_i$, i.e., with the increment of the delta phase $\Delta P$ of the sampling points, the above noted address generator 70 generates the address under a formula AD=Q+(M×N). In this formula, AD is the address data generated by the address generator 70, M is a number of cycles of the analog signal used for the AD conversion, Q is a current cycle where Q=0, 1, . . . M−1, and N is a position of the sampling pulse.

Figure 10D:
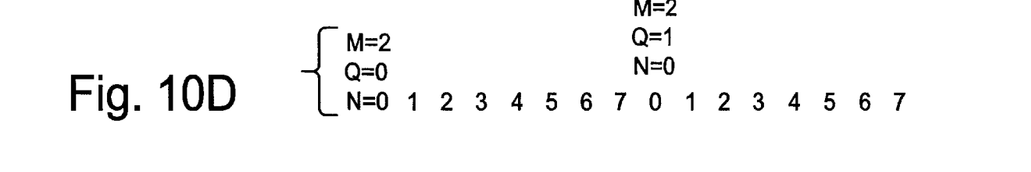
Figure 10E:
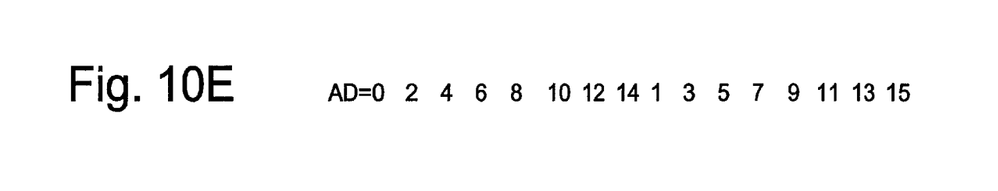

In the example of FIG. 10, since the number of cycle is two, the variables M, Q and N take such numbers as shown in FIG. 10D where the number of sampling points in one cycle is, for example, eight. Thus, the address data AD generated by the address generator 70 is 0, 2, 4, . . . 14, 1, 3, 5, . . . 15 as shown in FIG. 10E. Therefore, in the address "0" of the memory 50, the digital data of the sampling point $1_1$ (first cycle T1) is stored, in the address "1", the data of the sampling point $1_2$ (second cycle T2) is stored. Further, in the address "2" of the memory 50, the digital data of the sampling point $2_1$ (first cycle T1) is stored, and in the address "3", the data of the sampling point $2_2$ (second cycle T2) is stored, and so on. As a consequence, the digital data is stored in the acquisition memory 50 as if the data were acquired by an AD converter actually having a sampling speed two times higher than the AD converter 30.

As described in the foregoing, according to the present invention, an input analog signal which repeats the same wave form in the time period T by M cycles is AD-converted for the M cycles wherein a phase of the sampling clock is shifted by a predetermined amount $\Delta P$ for each cycle. As a result, the data obtained in the AD conversion process of the present invention shows resolution M times higher than that obtained in the normal AD conversion. In other words, an equivalent sampling frequency is increased by M times. Therefore, a digitizer of high resolution and high speed is achieved without using a plurality of AD converters or a higher frequency sampling clock. Accordingly, the mixed signal test system having a high performance digitizer is realized with low cost and small circuit size.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A mixed signal test system for testing a semiconductor device having both an analog function and a digital function, comprising:

a functional test unit for testing a digital function of a device under test (DUT) by providing a logic test pattern to the DUT and evaluating a response output of the DUT; an analog test unit for testing an analog function of the DUT by providing a test signal to the DUT and evaluating an analog output of the DUT; and a synchronous control unit for synchronizing operations between the functional test unit and the analog test unit;

wherein the analog test unit, including:

a digitizer for converting the analog output of the DUT into a digital signal wherein a wave form of the analog signal in a fixed time period T is repeated by a plurality of cycles and wherein each wave form is sampled at two or more sampling points within each time period T by a sampling clock wherein the sampling clock for sampling the analog output is phase shifted by a predetermined amount for each cycle of the wave form; and an acquisition memory for storing the digital signal from the digitizer in addresses thereof specified by the phase shift in the sampling clock.

2. A mixed signal test system as defined in claim 1, wherein the analog test unit furthers includes an address generator for generating address data for the acquisition memory to store the digital data in continuous addresses of the acquisition memory in an order of sampling points on the wave form in the analog output corresponding to a minimum difference of the phase shift of the sampling clock.

3. A mixed signal test system as defined in claim 1, wherein the functional test unit includes a timing generator for generating timing signals for controlling timing relationships within the test system, a pattern generator for generating a test pattern, and a format controller for producing the logic test pattern based on the test pattern from the pattern generator and the timing signal from the timing generator for testing the digital function of the DUT.

4. A mixed signal test system as defined in claim 1, wherein the digitizer includes a phase shifter which produces the sampling clock whose phase is shifted at each cycle of the wave form repeated in the analog output, an analog-to-digital (AD) converter for converting the analog output of the DUT to the digital signal based on the sampling clock which is phase shifted by the phase shifter, and a controller,for controlling the amount of phase shift in the sampling clock to be produced by the phase.

5. A mixed signal test system as defined in claim 4, wherein the digitizer further includes a low pass filter for removing frequency components higher than a predetermined frequency which is a function of a frequency of the sampling clock.

6. A mixed signal test system as defined in claim 4, wherein the phase shifter produces the phase shifted sampling clock based on a clock signal from the synchronous control unit and information from the controller regarding a number of cycles of the wave form repeated in the analog output for which AD conversion by the AD converter is conducted.

7. A mixed signal test system as defined in claim 6, wherein the phase shifter includes a frequency multiplier for multiplying a frequency of the clock signal from the synchronous control unit and a frequency divider for dividing an output frequency of the frequency multiplier by the number of cycles provided from the controller wherein an operation of the frequency divider is disabled for one cycle of the output frequency of the frequency multiplier at a start of each cycle of the wave form repeated in the analog output for which the AD conversion is performed.

8. A mixed signal test system for testing a semiconductor device having both an analog function and a digital function, comprising:

a functional test unit for testing a digital function of a device under test (DUT) by providing a logic test pattern to the DUT and evaluating a response output of the DUT;

an analog test unit for testing an analog function of the DUT by providing a test signal to the DUT and evaluating an analog output of the DUT; and a synchronous control unit for synchronizing operations between the functional test unit and the analog test unit;

wherein the analog test unit, including:

a digitizer for converting the analog output of the DUT into a digital signal wherein a wave form of the analog signal in a fixed time period T is repeated by a plurality of cycles and wherein each wave form is sampled at two or more sampling points within each time period T by a sampling clock wherein the sampling clock for sampling the analog output is phase shifted by a predetermined amount for each cycle of the wave form;

an acquisition memory for storing the digital signal from the digitizer; and an address generator for generating address data for the acquisition memory in response to the phase shift in the sampling clock to store the digital data in continuous addresses of the acquisition memory in a predetermined order of sampling points on the wave form repeated in the analog output in such a way that the digital data is acquired by an AD converter using a sampling clock whose frequency is M times higher than the sampling clock actually used.

9. A mixed signal test system as defined in claim 8, wherein the address generator generates address data AD based on a formula AD=Q+(M×N) where M is a number of cycles of the wave form repeated in the analog signal used for the AD conversion, Q is a current cycle where Q=0, 1, M−1, and N is a position of the sampling pulse.

10. A mixed signal test system as defined in claim 8, wherein the address generator includes a period counter for counting a constant period signal from the synchronous control unit, a first adder provided with data showing the number of cycles of the wave form repeated in the analog output for which the AD conversion is performed, a gate circuit provided with the constant period signal and an output of the first adder, a second adder connected to an output of the period counter, and a register which is provided with an output of the second adder and produces the address data at timings of the phase shifted sample clock.

11. A mixed signal test system as defined in claim 8, wherein the address generator includes a lower bit counter which increments by one at every pulse of a constant period signal, an upper bit counter which increments by one at every pulse of the phase shifted sampling clock, and a flip-flop connected to an output of the lower bit counter and is provided with the phase shifted sampling clock, wherein the flip-flop produces a lower bit of the address data and the upper bit counter produces an upper bit of the address data.

12. A mixed signal test system as defined in claim 8, wherein the digitizer includes a phase shifter which produces the sampling clock whose phase is shifted at each cycle of the wave form repeated in the analog output, an analog-to-digital (AD) converter for converting the analog output of the DUT to the digital signal based on the sampling clock which is phase shifted by the phase shifter, and a controller for controlling the amount of phase shift in the sampling clock to be produced by the phase shifter.

13. A mixed signal test system as defined in claim 12, wherein the phase shifter produces the phase shifted sampling clock based on a clock signal from the synchronous control unit and information from the controller regarding a number of cycles of the wave form repeated in the analog output for which AD conversion by the AD converter is conducted.

* * * * *